United States Patent [19]

Hayakawa et al.

[11] Patent Number: 4,901,326

[45] Date of Patent: Feb. 13, 1990

[54] SEMICONDUCTOR LASER DEVICE

[75] Inventors: Toshiro Hayakawa, Yokohama; Takahiro Suyama, Nara; Masafumi Kondo, Nara; Kosei Takahashi, Nara, all of Japan

[73] Assignee: Sharp Kabushiki Kaisha, Osaka, Japan

[21] Appl. No.: 254,080

[22] Filed: Oct. 6, 1988

[30] Foreign Application Priority Data

Oct. 8, 1987 [JP] Japan .................................. 62-254920

[51] Int. Cl.$^4$ ............................................. H01S 3/19
[52] U.S. Cl. ........................................ 372/45; 372/44; 357/4; 357/17; 357/60
[58] Field of Search ................ 372/44, 45; 357/4, 17, 357/60

[56] References Cited

FOREIGN PATENT DOCUMENTS 13334236  4/1985  Fed. Rep. of Germany .
64-12592  1/1989  Japan .
1378128  12/1974  United Kingdom .................. 372/45

OTHER PUBLICATIONS

Patent Abstracts of Japan, vol. 7, No. 292, E-219, 1437, 27 Dec. 1983.
Patent Abstracts of Japan, vol. 5, No. 40, E-49, 712, 17 Mar. 1981.
Sanada et al., (1987) Applied Physics Letters 51(14): 1054-1056.
U.S. patent application Ser. No. 07/031,678 (filing date: Mar. 30, 1987), 16 pages.
Japanese Journal of Applied Physics, vol. 27, No. 3, Mar. 1988, pp. L300-L303.
Physical Review B Condensed Matter, vol. 38, No. 2, 15 Jul. 1988, pp. 1526-1528.
Japanese Journal of Applied Physics, vol. 27, No. 5, May 1988, pp. L762-L765.
Division of Chemistry of Functional Dyes, Kinki Chemical Society, Japan, Aug. 1, 1988.
Japanese Journal of Applied Physics, vol. 27, No. 6, Jun. 1988, pp. L979-L982.
Journal of Applied Physics, vol. 64, No. 1, 1 Jul. 1988, pp. 297-302.
Extended Abstracts of the 19th Conference on Solid State Devices and Materials, Aug. 25-27, 1987, Tokyo, Japan, pp. 103-106.
Appl. Phys. Lett. 52(5), 1 Feb. 1988, pp. 339-341.
Appl. Phys. Lett., vol. 51, No. 21, 23 Nov. 1987, pp. 1704-1707.
Physical Review Letters, vol. 60, No. 4, 25 Jan. 1988, pp. 349-352.
Journal of Applied Physics, vol. 64, No. 5, 1 Sep. 1988, pp. 2764-2766.
Japanese Journal of Applied Physics, vol. 26, No. 4, Apr. 1987, pp. L302-L305.

Primary Examiner—William L. Sikes
Assistant Examiner—Georgia Y. Epps
Attorney, Agent, or Firm—Irell & Manella

[57] ABSTRACT

A semiconductor laser device of this invention comprises a plurality of semiconductor epitaxial layers grown on a semiconductor substrate, wherein the growth plane of said substrate is substantially the (111) plane.

12 Claims, 3 Drawing Sheets

SEMICONDUCTOR LASER DEVICE

BACKGROUND OF THE INVENTION

1. Field of the invention:

This invention relates to a semiconductor laser device and more particularly to a semiconductor laser device with high reliability that can be produced by vapor phase epitaxy such as molecular beam epitaxy (MBE), metal-organic chemical vapor deposition (MO-CVD), gas source molecular beam epitaxy (GS-MBE), etc.

2. Description of the prior art:

In recent years, an epitaxial growth technique for the formation of thin films such as MBE, MD-CVD, GS-MBE, etc., has been developed which enables the formation of epitaxially grown thin layers having a thickness of as thin as approximately 10 Å or less that is the order of a monolayer. In the field of semiconductor laser devices, the development of such an epitaxial growth technique, although these significantly thin films have not yet been produced by the conventional growth technique that is carried out under conditions where thermal equilibrium is approximately established, such as liquid phase epitaxy (LPE), vapor phase epitaxy in which hydrides or chlorides are used as starting materials, etc., allowed a device structure with significantly thin films to be applied to laser devices, resulting in semiconductor laser devices with improved device characteristics. For example, when the conventional LPE is used, it is difficult to form a double heterostructure uniformly over the entire surface of a wafer while maintaining a steep gradient of the composition of semiconductor materials at the interface of the heterojunction. This construction of semiconductor laser devices can readily be achieved by the use of MBE or MO-CVD. Also, the higher limit of output power attained by a semiconductor laser device with a double heterostructure is dependent mainly on the intensity of laser light in an active layer thereof. As mentioned above, the active layer can readily be produced so as to have a thickness of 500 Å or less by the use of MBE or MO-CVD. Therefore, the laser light can permeate into a cladding layer thereof, and thus the intensity of laser light in the active layer decreases, so that a higher limit of output power can be improved.

The vapor phase epitaxy such as MBE, MO-CVD, etc., have the excellent advantages mentioned above and can attain the uniform formation of epitaxially grown layers over a large wafer with a diameter of 2 inches or more. However, these techniques have not been widely applied to mass production of semiconductor laser devices because the reproducibility of crystals with sufficient quality to provide semiconductor laser devices with high reliability is invariably poor.

Conventional semiconductor laser devices have a device structure that is epitaxially formed on the (100) plane of a semiconductor substrate. When the above-mentioned growth techniques that are carried out under conditions where thermal equilibrium is not achieved are used for the formation of such a device structure, the control of crystallinity cannot readily be attained, so that semiconductor laser devices with high reliability cannot be produced with good reproducibility and in good yield. That is, for example, when these techniques are used for the production of a group III-V compound semiconductor laser device, the ratio of the group V to the group III in the layer to be grown should be controlled so as to be constant, in order to reduce vacancies at the positions of the group III atoms and the group V atoms or point defects such as interstitials, etc.

When LPE is used, a semiconductor layer that is being grown is covered with the melt containing the group III atoms or the group V atoms, so that the semiconductor layer is not contaminated by large amounts of oxygen, water, hydrocarbon, etc., that are contained in a surrounding atmosphere. In contrast, when vapor phase epitaxy such as MBE, MO-CVD, etc., is used, it is difficult to maintain the surrounding atmosphere clean, so that these impurities are directly incorporated into the semiconductor layer from a vapor phase. These difficulties are responsible for a decrease in the reproducibility of semiconductor laser devices with high reliability.

Moreover, when LPE is used, the semiconductor layer is grown on a substrate disposed horizontally by the use of a sliding-boat method, so that there is no large stress applied to the substrate during the growth. However, when the substrate is fixed by the use of metallic indium (In) in carrying out MBE, the substrate carries stress by subjecting to the alloying reaction with the molten In and/or by solidifying the molten In with a decrease in temperature after growth. Also, when the substrate is mechanically fixed without using In in carrying out MBE, or when the substrate is inclined, in order to improve the uniformity of growth or in order to perform the growth on a plurality of substrates, the substrate carries stress on the fixed part thereof, which causes the generation of dislocations in the epitaxial layers grown on the substrate during the growth. The dislocations generated by the stress result in a poor yield of semiconductor laser devices with high reliability.

Recently, the inventors of this invention found the fact that the quantum effect of a semiconductor device in the <111> direction is greater than that of a conventional semiconductor device in the <100> direction. Based on this fact, the inventors succeeded in the production of a semiconductor device having excellent device characteristics by the use of the quantum effect in the <111> direction in which a device structure of the said device is formed on the (111) plane of a substrate (U.S. patent application Ser. No. 159,797).

SUMMARY OF THE INVENTION

The semiconductor laser device of this invention, which overcomes the above-discussed and numerous other disadvantages and deficiencies of the prior art, comprises a plurality of semiconductor epitaxial layers grown on a semiconductor substrate, wherein the growth plane of said substrate is substantially the (111) plane.

In a preferred embodiment, the growth plane of said substrate is the exact (111) plane.

In a preferred embodiment, the growth plane of said substrate is inclined at an angle of 5 degree or less from the (111) plane, preferably toward the (100) plane.

In a preferred embodiment, the plurality of semiconductor epitaxial layers are grown on said semiconductor substrate by vapor phase epitaxy such as MBE, MO-CVD, GS-MBE, etc.

In a preferred embodiment, the substrate is made of GaAs, GaSb, InAs, InP, GaF, or InSb.

In a preferred embodiment, the plurality of semiconductor epitaxial layers are made of a group III-V or II-VI compound semiconductor.

In a preferred embodiment, the laser device is of a double heterostructure.

Thus, the invention described herein makes possible the objective of providing a semiconductor laser device with high reliability that can be produced with good reproducibility and in good yield by vapor phase epitaxy such as MBE, MO-CVD, GS-MBE, etc.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
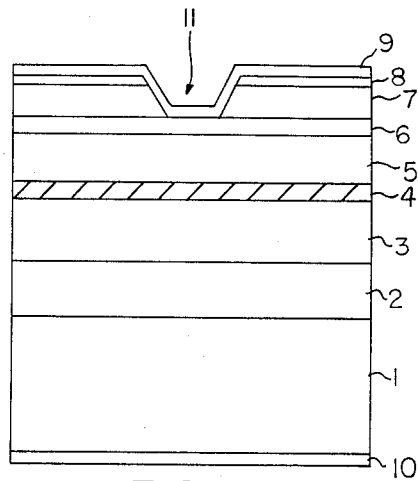
FIG. 1 is a front sectional view showing a semiconductor laser device with a double heterostructure of this invention.

The following definitions are provided, in order to remove ambiguities as to the intent or scope of their usage in the specification and claims.

The term (111) plane is used herein with the meaning of a growth plane that is substantially the (111) plane of a substrate. The (111) plane may be a growth plane that is exactly the (111) plane of a substrate, in which case it is termed the exact (111) plane. The (111) plane may also be a growth plane that is inclined, for example, at an angle of 0.5 degrees from the (111) plane of a substrate, in which case it is termed the (111) 0.5-degree inclined plane.

The structure of a semiconductor laser device in which crystal defects are not generated during the growth makes is possible to provide a semiconductor laser device with high reliability. The crystal defects in an epitaxially grown layer by MBE include mainly surface defects, slip lines generated by the stress in the fixed substrate, and dislocations generated during the growth.

The inventors of this invention found that the density of surface defects is of the order of 200 to 2000 cm$^{-2}$ for this kind of semiconductor laser device, resulting in a low probability of generating surface defects in the oscillating region. Moreover, the generation of surface defects is caused by external factors based on particle sized contaminants and/or a Ga cell, and hence it is independent of the plane orientation of the substrate.

The generation of slip lines by the stress in the fixed substrate is significantly dependent on the plane orientation of the substrate. For example, when a GaAs substrate is fixed by the use of In, the GaAs substrate is not completely wetted with molten In, resulting in its surface dotted with unwetted regions. When the molten In begins to solidify with a decrease in temperature, the wetted regions of the substrate shrink highly as compared with the unwetted regions. Therefore, the unwetted regions of the GaAs substrate carry tension, whereby slip lines are generated in the GaAs substrate which has poor tensile strength. Also, when the substrate is mechanically fixed without using In, the substrate carries stress on the fixed part thereof, resulting in slip lines. The generation and propagation of these slip lines are significantly correlated with the strength of the substrate in the direction parallel to the surface thereof. In the crystals with a zincblende structure such as GaAs, three of the four chemical bondings in the tetrahedral coordination are present in the direction substantially parallel to the (111) plane that constitutes one of the four faces of the regular tetrahedron. Therefore, these crystals have a tensile strength larger in the direction parallel to the (111) plane thereof than in the direction parallel to the (100) plane thereof. In fact, when the (111) plane of a substrate is used as a growth plane, the density of slip lines decreased about one order or more of magnitude as compared with the case of the growth on the (100) plane.

Figure 2:
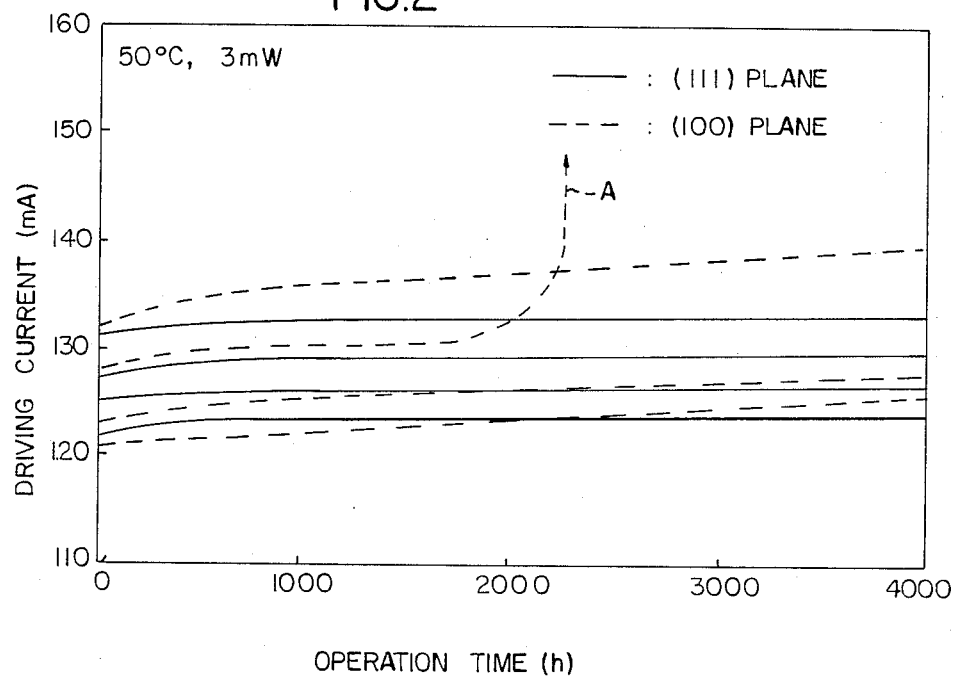
FIG. 2 is of characteristic curves showing the variation of driving current with operation time with regard to the semiconductor laser device shown in FIG. 1.

Moreover, dislocations generated during the growth include dislocations that are propagated from the substrate to the epitaxial layer grown thereon, dislocations that are newly generated by the presence of nuclei during the growth, etc. Based on a difference in the growth process, these dislocations are decreased when the growth is on the (111) plane. In fact, as shown in FIG. 2, the semiconductor laser devices grown on the (111) plane have a rate of deterioration lower than that of a semiconductor laser devices grown on the (100) plane. This indicates that the generation of point defects such as vacancies, interstitials, etc., is significantly decreased in the devices grown on the (111) plane as compared with those grown on the (100) plane, which reflects the difference in the growth process. Therefore, when an epitaxial layer is grown on the (111) plane of a substrate, the possibility of incorporation of contaminants into the epitaxial layer is considered to be low as compared with the case of the growth on the (100) plane.

EXAMPLE 1

FIG. 1 shows a AlGaAs laser device with a double heterostructure of this invention, which is produced as follows: On the growth plane of a Si-doped n-GaAs substrate (Si=$2\times10^{18}$cm$^{-3}$) 1 that is inclined toward the (100) plane at an angle of 0.5 degrees from the (111)B plane, a Si-doped n-GaAs buffer layer (Si=$1\times10^{17}$cm$^{-3}$; the thickness thereof being 0.5 μm) 2, a Si-doped n-Al$_{0.38}$Ga$_{0.62}$As cladding layer (Si=$5\times10^{17}$cm$^{-3}$; the thickness thereof being 1.4 μm) 3, an undoped Al$_{0.08}$Ga$_{0.92}$As active layer (the thickness thereof being 0.07 μm) 4, a Be-doped p-Al$_{0.38}$Ga$_{0.62}$As cladding layer (Be=$5\times10^{17}$cm$^{-3}$; the thickness thereof being 1 μm) 5, a Be-doped p-GaAs cap layer (Be=$2\times10^{18}$cm$^{-3}$; the thickness thereof being 0.2 μm) 6, a Si-doped n-Al$_{0.5}$Ga$_{0.5}$As current blocking layer (Si=$5\times10^{17}$cm$^{-3}$; the thickness thereof being 0.6 μm) 7, and a Si-doped n-GaAs contact layer (Si=$5\times10^{17}$cm$^{-3}$; the thickness thereof being 0.2 μm) 8 were successively grown by molecular beam epitaxy. The growth temperature was 720° C. and the flux ratio of group V to group III was 2 to 3. The growth rate was 1.4 μm/h for the $Al_{0.38}Ga_{0.62}As$ cladding layers 3 and 5.

Next, the central portions of the current blocking layer 7 and the contact layer 8 were removed to form a stripe-shaped groove 11 with a width of 5 μm by a chemical etching technique, and a p-sided electrode 9 of AuZn/Au and an n-sided electrode 10 of AuGa/Ni/Au are disposed on the upper face of the contact layer and the inner face of the stripe-shaped groove 11 and on the back face of the substrate 1, respectively, by vacuum evaporation or the like. The wafer obtained was then cleaved, resulting in a semiconductor laser device with a cavity length of 250 μm.

Then, the cleavage planes of the semiconductor laser device obtained were protected by additional $Al_2O_3$ films with a thickness of λ/2. These $Al_2O_3$ films were formed by electron-beam evaporation. Finally, the semiconductor laser device was mounted on a Mo/Au-coated Cu heat sink by the use of a brazing material such as In, the p-side of the laser device being directed to the heat sink. The semiconductor laser device of this example oscillated at a threshold current of 100 to 120 mA, and emitted a laser beam of light with a wave length of 830 nm.

As a reference standard, semiconductor laser devices with the same structure as the above-mentioned were produced on the (100) plane of a Si-doped n-GaAs substrate at the same time in the same manner as the above-mentioned devices of this example.

In this way, semiconductor laser devices with a double heterostructure were obtained by MBE. These devices were evaluated by an aging test at 50° C. under conditions where the output power thereof was constant at 3 mW. FIG. 2 shows the variation of driving current for a long period of operation time with respect to the semiconductor laser devices on the (111) plane of a substrate according to this invention (indicated by solid lines) and the semiconductor laser devices on the (100) plane of a substrate as a reference standard (indicated by broken lines). As seen from FIG. 2, the ratio of an increase in driving current after 1000 to 2000 hours or more is 0.5 mA/kh or less for the semiconductor laser devices on the (111) plane, and 1 mA/kh for the semiconductor laser devices on the (100) plane, indicating that the device characteristics of the former is superior to those of the latter.

Although the semiconductor laser devices on the (100) plane continued to operate stably for 1000 hours or more, 10% or more of these laser devices deteriorated rapidly as shown by the broken line A in FIG. 2. In contrast, none of the semiconductor laser devices on the (111) plane of this invention exhibited such a rapid deterioration.

Moreover, the largest difference between the laser devices on the (111) plane and the laser devices on the (100) plane, which is not shown in FIG. 2, is that the percentage of the laser devices deteriorated rapidly within 100 hours at the beginning of the aging test was 5% or less for the laser devices on the (111) plane, whereas it was 50% or more for the laser devices on the (100) plane. The rapid deterioration within 100 hours may be caused by crystal defects (e.g., dislocations) that are present in the striped region for oscillation. The rapid deterioration after 1000 hours or more may be caused by crystal defects (e.g., dislocations) that are present in the vicinity of the striped region for oscillation. Thus, it is considered that these crystal defects were remarkably reduced by the use of the (111) plane as a growth plane.

The semiconductor laser devices with the same structure as the above-mentioned were produced several times and evaluated in the same manner as the above-mentioned device of this example. The semiconductor laser devices on the (111) plane with high reliability were consistantly obtained in good yield, whereas 50% to 95% of the laser devices grown on the (100) plane after aging for 100 hours were not fit for practical use. This indicates that a semiconductor laser device of this invention is significantly improved in its reproducibility by the use of the (111) plane as a growth plane.

EXAMPLE 2

Figure 3:
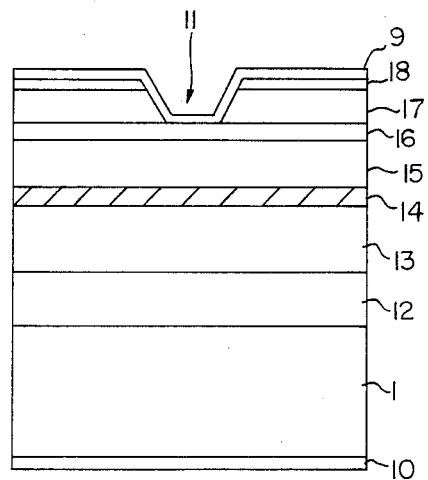
FIG. 3 is a front sectional view showing another semiconductor laser device with a double heterostructure of this invention.

FIG. 3 shows a GaInP/AlInGaP laser device with a double heterostructure of this invention, which is produced as follows: On the exact (111)B plane of a Si-doped n-GaAs substrate ($Si=2\times10^{18}cm^{-3}$) 1, a Se-doped n-GaInP buffer layer ($Se=5\times10^{17}cm^{-3}$; the thickness thereof being 0.5 μm) 12. a Se-doped n-$(Al_{0.6}Ga_{0.4})_{0.5}In_{0.5}P$ cladding layer $Se=5\times10^{17}cm^{-3}$; the thickness thereof being 1 μm) 13, an undoped $Ga_{0.5}In_{0.5}P$ active layer (the thickness thereof being 0.07 μm) 14, a Zn-doped p-$(Al_{0.6}Ga_{0.4})_{0.5}In_{0.5}P$ cladding layer ($Zn=7\times10^{17}cm^{-3}$; the thickness thereof being 1 μm) 15, a Zn-doped p-GaAs cap layer ($Zn=2\times10^{18}cm^{-3}$; the thickness thereof being 0.2 μm) 16, a Se-doped n-$Al_{0.5}Ga_{0.5}As$ current blocking layer ($Se=5\times10^{17}cm^{-3}$; the thickness thereof being 0.6 μm) 17, and a Se-doped n-GaAs contact layer ($Se=5\times10^{17}cm^{-3}$; the thickness thereof being 0.2 μm) 18 were successively grown by metal-organic chemical vapor deposition.

Figure 4:
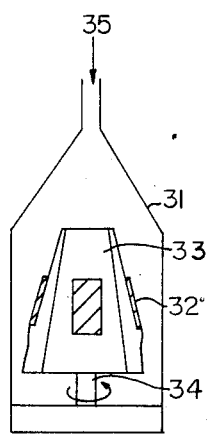
FIG. 4 is a schematic sectional view showing a MO-CVD growth apparatus that is used for the production of the semiconductor laser device shown in FIG. 3.

FIG. 4 shows an apparatus for growing the epitaxial layers mentioned above. The apparatus comprises a reactor tube 31 which is internally provided with a graphite susceptor 33 supported by a support rod 34. A plurality of substrates 32 are fixed on the susceptor 33. During the growth, the susceptor 33 on which the substrates 32 are fixed can be rotated around the axis of the support rod 34 as shown by the arrow in the Figure. The reactor tube 31 has at its top and a branch tube providing a gas inlet, through which source gases 35 are fed to the interior of the reactor tube 31.

The epitaxial growth of the semiconductor epitaxial layers on the substrate was carried out in the following manner using the above-mentioned apparatus:

Four substrates 32 (i.e., Si-doped n-GaAs substrates mentioned above) were fixed on the graphite susceptor 33, and the reactor tube 31 was evacuated until a pressure of 0.1 atmosphere was reached. The susceptor 33 was heated to raise the temperature of the substrates 32 up to 720° C. Then, the source gases 35 were fed to the reactor tube 31, while the susceptor 33 was being rotated. Thus, the semiconductor epitaxial layers mentioned above were successively grown on the n-GaAs substrate 32. As a source for group III, methylate compounds of Al, Ga, and In were used. As a source for group V, $PH_3$ and $AsH_3$ were used. As an impurity source, zinc dimethyl and hydrogen selenide were used. The growth temperature was 720° C. and the growth rate was 2 μm/h.

The wafer obtained was then cleaved, and the resulting semiconductor laser device with a cavity length of 250 μm was subjected to the same treatment as that of Example 1. The semiconductor laser device of this example oscillated continuously at room temperature at a threshold current of 120 to 140 mA, and emitted a laser beam of light with a wave length of 680 nm.

As a reference standard, semiconductor laser devices with the same structure as the above-mentioned were produced on the (100) plane of a Si-doped n-GaAs substrate at the same time in the same manner as the above-mentioned device of this example.

In this way, semiconductor laser devices with a double heterostructure were obtained by MO-CVD. These laser devices were evaluated by an aging test at 30° C. under conditions where the output power thereof was constant at 3 mW. After aging for 100 hours, 95% or more of the laser devices on the (111) plane were fit for the practical use, whereas 50% or more of the laser devices on the (100) plane were not fit for practical use. This indicates that the semiconductor laser device on the (111) plane of this invention has reliability higher than that of the laser device grown on the (100) plane.

Figure 5:
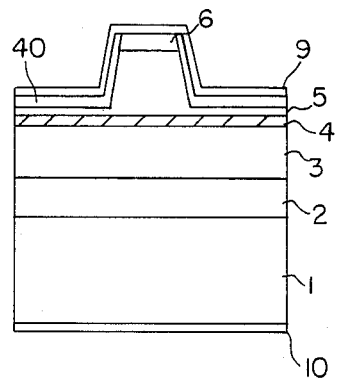
FIG. 5 is a front sectional view showing a semiconductor laser device with a ridge waveguide structure of this invention.
Figure 6:
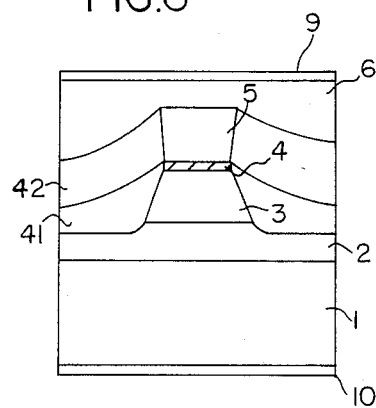
FIG. 6 is a front sectional view showing a semiconductor laser device with a buried structure of this invention.
Figure 7:
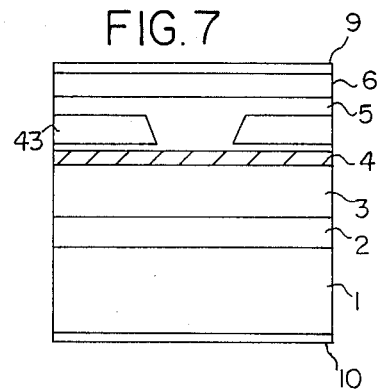
FIG. 7 is a front sectional view showing a semiconductor laser device with a self-aligned structure of this invention.

Although the above-mentioned examples disclose only gain guided laser devices with a double heterostructure, this invention is, of course, applicable to any semiconductor laser device; for example, this invention is applicable to a variety of index guided laser devices with a stabilized transverse mode. FIGS. 5 to 7 show several examples of these semiconductor laser devices of a AlGaAs type; that is, a semiconductor laser device with a ridge waveguide structure is shown in FIG. 5; a semiconductor laser device with a buried structure is shown in FIG. 6; and a semiconductor laser device with a self-aligned structure is shown in FIG. 7. The parts shown by reference numerals 1 to 6, 9, and 10 in FIGS. 5 to 7 correspond to those of the semiconductor laser device of Example 1 shown by these reference numerals, respectively. Moreover, reference numerals 40, 41, 42, and 43 in FIGS. 5 to 7 indicate a SiNx layer, a p-type buried layer, an n-type buried layer, and an n-type current blocking layer, respectively.

Although the above-mentioned examples disclose only AlGaAs laser devices and AlGaInP laser devices, this invention is, of course, applicable to any type of semiconductor laser device; for example, this invention is applicable to InGaAsP or InGaAlAs laser devices on an InP substrate and AlGaSb or PbSnTa laser devices on a GaSb substrate.

Moreover, the growth plane of a substrate is not limited to the exact (111)B plane nor the (111)B 0.5-degree inclined plane, but it is conveniently selected depending upon the growth method and conditions to be used which plane of a substrate that is inclined at a certain angle from the (111) plane of the substrate is the most pertinent and which plane of a substrate is more suitable, the A plane or the B plane.

Furthermore, the growth method of this invention is not limited to MBE and MO-CVD, but GS-MBE or chemical beam epitaxy (CBE) can also be used in which one or all parts of the source are in a gas phase.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, the combination of:
   a semiconductor substrate;
   a first electrode formed under said substrate;
   a buffer layer formed on said substrate;
   a double heterostructure laser operating area comprising successively a first cladding layer, an active layer, and a second cladding layer on said buffer layer;
   a cap layer formed on said laser operating area;
   a current blocking layer formed on said cap layer, said current blocking layer having a stripe-shaped groove;
   a contact layer formed on the upper face of said current blocking layer; and
   a second electrode formed on the upper face of said contact layer and on the inner face of said stripe-shaped groove;
   wherein the growth plane of said substrate is substantially the (111) plane and said double heterostructure laser operating area is disposed above said growth plan.

2. A device according to claim 1, wherein:
   said semiconductor substrate comprises an n-GaAs substrate;
   said buffer layer comprises an n-GaInP buffer layer;
   said first cladding layer comprises an n-AlGaInP cladding layer;
   said active layer comprises a GaInP active layer;
   said second cladding layer comprises a p-AlGaInP cladding layer;
   said cap layer comprises a p-GaAs cap layer;
   said current blocking layer comprises an n-AlGaAs current blocking layer;
   said contact layer comprises an n-GaAs contact layer; and
   said growth plane of said substrate is the exact (111) plane.

3. A device according to claim 1, wherein:
   said semiconductor substrate comprises an n-GaAs substrate;
   said buffer layer comprises an n-GaAs buffer layer;
   said first cladding layer comprises an n-AlGaAs cladding layer;
   said active layer comprises an AlGaAs active layer;
   said second cladding layer comprises a p-AlGaAs cladding layer;
   said cap layer comprises a p-GaAs cap layer;
   said current blocking layer comprises an n-AlGaAs current blocking layer;
   said contact layer comprises an n-GaAs contact layer; and
   said growth plane of said substrate is inclined at an angle of 5 degrees or less from the (111) plane.

4. A device according to claim 1, wherein said semiconductor layers are grown on said semiconductor substrate by vapor phase epitaxy.

5. A device according to claim 1, wherein said substrate is made of GaAs, GaSb, InAs InP, GaP, or InSb.

6. A device according to claim 1, wherein said semiconductor layers are made of a group III-V or II-VI compound semiconductor.

7. In a semiconductor laser device, the combination of:
   a semiconductor substrate;
   a first electrode formed under said substrate;
   a buffer layer formed on said substrate;

a double heterostructure laser operating area comprising successively a first cladding layer, an active layer, and a second cladding layer on said buffer layer, said second cladding layer having a striped ridge positioned opposite to the active layer side;

a cap layer formed on the top surface of said striped ridge;

an insulating layer formed on the portion of the surface of said second cladding layer other than said striped ridge and on the side walls of said striped ridge and said cap layer; and a second electrode formed on said cap layer and said insulating layer;

wherein the growth plane of said substrate is substantially the (111) plane and said double heterostructure laser operating area is disposed above said growth plane.

8. A device according to claim 7, wherein:
said semiconductor substrate comprises an n-GaAs substrate;
said buffer layer comprises an n-GaAs buffer layer;
said first cladding layer comprises an n-AlGaAs cladding layer;
said active layer comprises an AlGaAs active layer;
said second cladding layer comprises a p-AlGaAs cladding layer;
said cap layer comprises a p-GaAs cap layer; and
said insulating layer comprises a SiNx insulating layer.

9. In a semiconductor laser device, the combination of:
a semiconductor substrate;
a first electrode formed under said substrate;
a buffer layer formed on said substrate;
a double heterostructure laser operating area in the form of a striped mesa comprising successively a first cladding layer, an active layer, and a second cladding layer on the center portion of the surface of said buffer layer;
a multi-layer structure burying both sides of said laser operating area, said multi-layer structure having successively a first burying layer and a second burying layer on the remaining portion of the surface of said buffer layer;

a cap layer formed on the top surface of said striped mesa and on said second burying layer; and
a second electrode formed on said cap layer;
wherein the growth plane of said substrate is substantially the (111) plane and said double heterostructure laser operating area is disposed above said growth plane.

10. A device according to claim 9, wherein:
said semiconductor substrate comprises an n-GaAs substrate;
said buffer layer comprises an n-GaAs buffer layer;
said first cladding layer comprises an n-AlGaAs cladding layer;
said active layer comprises an AlGaAs active layer;
said second cladding layer comprises a p-AlGaAs cladding layer; and
said cap layer comprises a p-GaAs cap layer.

11. In a semiconductor laser device, the combination of:
a semiconductor substrate;
a first electrode formed under said substrate;
a buffer layer formed on said substrate;
a double heterostructure laser operating area comprising successively a first cladding layer, an active layer, and a second cladding layer on said buffer layer, said second cladding layer containing a current blocking layer with an opening portion extending therethrough in the form of a stripe;
a cap layer formed on said laser operating area; and
a second electrode formed on said cap layer;
wherein the growth plane of said substrate is substantially the (111) plane and said double heterostructure laser operating area is disposed above said growth plane.

12. A device according to claim 11, wherein:
said semiconductor substrate comprises an n-GaAs substrate;
said buffer layer comprises an n-GaAs buffer layer;
said first cladding layer comprises an n-AlGaAs cladding layer;
said active layer comprises an AlGaAs active layer;
said second cladding layer comprises a p-AlGaAs cladding layer; and
said cap layer comprises a p-GaAs cap layer.

* * * * *